United States Patent [19]
Hachisu et al.

[11] Patent Number: 5,760,525
[45] Date of Patent: *Jun. 2, 1998

[54] SURFACE ACOUSTIC WAVE DEVICE AND COMMUNICATION SYSTEM USING IT

[75] Inventors: Takahiro Hachisu, Yokohama; Akira Torisawa; Norihiro Mochizuki, both of Machida; Koichi Egara, Tokyo; Tadashi Eguchi, Kawasaki; Akihiro Koyama, Yokohama, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 681,493

[22] Filed: Jul. 23, 1996

Related U.S. Application Data

[63] Continuation of Ser. No. 168,385, Dec. 17, 1993, abandoned.

[30] Foreign Application Priority Data

Dec. 18, 1992 [JP] Japan ................................. 4-354855

[51] Int. Cl.$^6$ ............................................... H01L 41/08
[52] U.S. Cl. ................................................ 310/313 B
[58] Field of Search ........................ 310/313 B, 313 D, 310/313 R, 153, 154, 195, 819–821; 333/153, 154, 195; 364/819–821

[56] References Cited

U.S. PATENT DOCUMENTS

| | | | |
|---|---|---|---|
| 3,654,574 | 4/1972 | Dias | 333/153 |
| 4,428,062 | 1/1984 | Michaels | 364/821 |
| 4,453,242 | 6/1984 | Toda | 310/313 R |
| 4,473,888 | 9/1984 | Smith | 364/821 |
| 4,499,393 | 2/1985 | Stokes et al. | 313/313 A |
| 4,675,839 | 6/1987 | Kerr | 364/821 |
| 4,799,184 | 1/1989 | Grassl | 364/821 |
| 4,894,576 | 1/1990 | Okamoto et al. | 310/313 D |
| 4,900,969 | 2/1990 | Mitsutsuka et al. | 310/313 A |
| 4,952,833 | 8/1990 | Nothnick | 310/313 D |
| 5,043,620 | 8/1991 | Mitsutsuka | 310/313 D |
| 5,164,628 | 11/1992 | Egara et al. | 310/313 D |
| 5,200,663 | 4/1993 | Mochizuki et al. | 310/313 D |

OTHER PUBLICATIONS

"Focused Surface Wave Transducers on Anisotropic Substrates; A Theory Developed For The Waveguided Storage Correlator" by J.B. Green et al. 1980 Ultrasonics Symposium; IEEE 1980, pp. 69–73.

"Convolutions and Time Inversion Using Parametric Interactions of Acoustic Surface Waves" by M. Luukkala et al., p. 393, Applied Physics Letters, May 1, 1971.

*Primary Examiner*—Thomas M. Dougherty
*Attorney, Agent, or Firm*—Fitzpatrick, Cella, Harper & Scinto

[57] ABSTRACT

A surface acoustic wave device includes a piezoelectric substrate, first and second input transducers formed on the substrate and adapted for respectively generating surface acoustic waves corresponding to input signals, the first and second input transducers each having a shape to focus the surface acoustic waves generated thereby, an output transducer formed between the first and second input transducers on the substrate and adapted for obtaining a convolution -signal of the surface acoustic waves generated by the first and second input transducers, and conductive films, one formed between the first input transducer and the output transducer and another between the second input transducer and the output transducer on the substrate. A communication system includes a transmitter for transmitting a signal modulated according to information, a circuit for receiving the modulated signal transmitted from the transmitter, a circuit for generating a reference signal, a surface acoustic wave device, as described above, for outputting a convolution signal of the modulated signal and the reference signal, and a demodulating circuit for restoring the information, using the convolution signal output from the surface acoustic wave device.

36 Claims, 7 Drawing Sheets

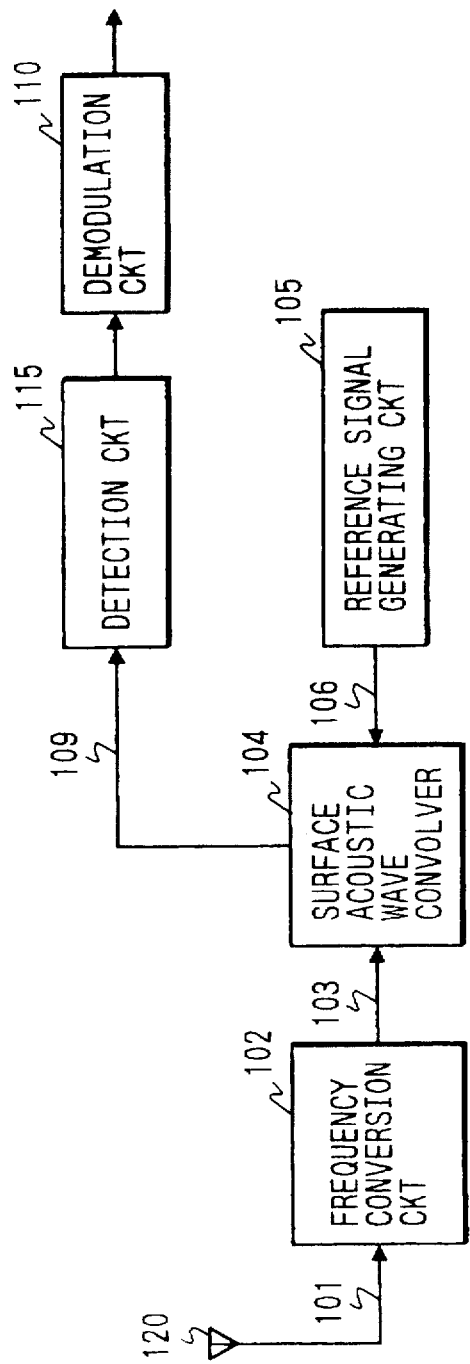

SURFACE ACOUSTIC WAVE DEVICE AND COMMUNICATION SYSTEM USING IT

This application is a continuation, of application Ser. No. 08/168,385 filed Dec. 17, 1993, now abandoned.

BACKGROUND OF THE INVENTION

1. Field of the Invention

The present invention relates to a surface acoustic wave device utilizing the physical nonlinear effect of piezoelectric substrate to output a convolution signal of two input signals, and a communication system using it.

2. Related Background Art

The surface acoustic wave device has been increasingly important in recent years, as a key device in making the spread spectrum communication. Also, it has been noted in many applications as the real-time signal processing device and studied actively.

FIG. 1 is a schematic plan view to show an example of conventional surface acoustic wave (SAW) device. In FIG. 1, reference numeral 11 designates a piezoelectric substrate made of Y-cut (Z-propagating) lithium niobate crystal or the like, 12 input interdigital transducers (IDT) which are arcuate comb electrodes formed on the surface of piezoelectric substrate 11, and 13 an output transducer which is a waveguide electrode formed on the surface of piezoelectric substrate 11. These electrodes are made of a conductive material such as aluminum and usually formed directly on the surface of piezoelectric substrate 11, utilizing the photolithography technology.

When an electric signal with carrier angular frequency $\omega$ is input into the two input IDTs 12 in such SAW device as so arranged, the piezoelectric effect of the substrate excites surface acoustic waves. Since these two surface acoustic waves are excited by the input IDTs which are the arcuate comb electrodes, they propagate as being focused to increase the energy density and reach the output transducer 13. The output transducer 13 acts as a waveguide so that these two surface acoustic waves propagate in mutually opposite directions on the piezoelectric substrate 11 as confined or trapped in the output electrode.

When the two surface acoustic waves collide with each other on the output transducer 13, the physical nonlinear effect of piezoelectric substrate 11 produces a convolution signal (with carrier angular frequency $2\omega$) of the two input signals, which is to be taken out.

Letting $F(t-x/v)\exp\{j(\omega t-kx)\}$ and $G(t+x/v)\exp\{j(\omega t+kx)\}$ stand for the two surface acoustic waves (SAW), the nonlinear interaction produces a surface acoustic wave of their product $F(t-x/v) \cdot G(t+x/v)\exp(2j\omega t)$ on the piezoelectric substrate 11. Providing a uniform output electrode, this signal can be integrated within a region of length of the electrode. Letting L be a length of interaction region, an output signal can be expressed as follows.

$$S(t) = K\exp(2j\omega t) \int_{-L/2}^{L/2} F(t-x/v) \cdot G(t+x/v) dx \quad (1)$$

Here, the integration range can be deemed as substantially between $-\infty$ and $+\infty$ if the interaction region length L is sufficiently larger than the signal length. Putting $\tau=t-x/v$ into above Equation (1), the following equation is obtained.

$$S(t) = -vK\exp(2j\omega t) \int_{-I}^{I} F(\tau) \cdot G(2t-\tau) d\tau \quad (2)$$

In the above equation, I for integration range represents $\infty$. The resultant signal is a convolution of the two SAW input signals. Here, since the shape of input electrodes 12 is arcuate, the thus excited surface acoustic waves are focused and the energy density thereof is increased, thereby increasing the convolution efficiency (ratio of output signal to input signal).

Such mechanism of convolution is described in detail for example in "Handbook of Technology for Surface Acoustic Wave Devices" compiled by the 150-th committee of surface acoustic wave device technology in Japan Society for the Promotion of Science, pp 377-379, OHM SHA, LTD (1991).

The piezoelectric substrate of lithium niobate crystal, however, has anisotropy, which makes a propagation speed of surface acoustic wave differ depending upon the direction of propagation. Then, in case the comb electrodes forming the input IDTs were arcuate, such a problem was arisen that surface acoustic waves excited in segmental areas of each arcuate electrode reached the entrance end of output transducer (waveguide electrode) in different times. The difference causes a phase shift between surface acoustic waves at the entrance end of waveguide, which in turn causes an input loss, thereby resulting in lowering the convolution efficiency.

Also, it was difficult to design the shape and position of input IDTs and the position of output transducer taking into consideration the anisotropy of SAW propagation speed on the piezoelectric substrate. It was, therefore, difficult to focus with high efficiency the surface acoustic waves excited by the input electrodes into the waveguide.

SUMMARY OF THE INVENTION

It is, therefore, an object of the present invention to solve the problems in the conventional technology as described above, and then to provide a surface acoustic wave device which can reduce the drop of convolution efficiency due to the phase shift between surface acoustic waves, and a communication system using it.

In an embodiment of the present invention achieving the above object, a surface acoustic wave device comprises:

a piezoelectric substrate;

first and second input transducers formed on said substrate and adapted for respectively generating surface acoustic waves corresponding to input signals, said first and second input transducers each having a shape to focus the surface acoustic waves generated thereby;

an output transducer formed between said first and second input transducers on said substrate and adapted for obtaining a convolution signal of said input signals from a surface acoustic wave generated by nonlinear interaction of the surface acoustic waves generated by said first and second input transducers; and a conductive film which is formed in at least one of between the output transducer and the first input transducer and between the output transducer and the second input transducer, on the substrate.

Also, a method for obtaining a convolution signal, using the above surface acoustic wave device, comprises:

a step of inputting an input signal into each of the first and second input transducers;

a step of making the first and second input transducers respectively generate surface acoustic waves corresponding to the input signals;

a step of obtaining a convolution signal of said input signals from a surface acoustic wave generated by nonlinear interaction of the surface acoustic waves generated by said first and second input transducers; and a step of outputting the convolution signal from the output transducer.

In another embodiment of the present invention, a signal receiver comprises:

a circuit for receiving a modulated signal transmitted from a transmitter;

a circuit for generating a reference signal;

a surface acoustic wave device for outputting a convolution signal of the modulated signal and the reference signal; and a circuit for demodulating information, using the convolution signal output from the surface acoustic wave device;

wherein said surface acoustic wave device comprises:

a piezoelectric substrate;

first and second input transducers formed on said substrate and adapted for respectively generating surface acoustic waves corresponding to the modulated signal and the reference signal, said first and second input transducers each having a shape to focus the surface acoustic waves generated thereby;

an output transducer formed between said first and second input transducers on said substrate and adapted for obtaining a convolution signal of the modulated signal and the reference signal from a surface acoustic wave generated by nonlinear interaction of the surface acoustic waves generated by said first and second input transducers; and a conductive film which is formed in at least one of between the output transducer and the first input transducer and between the output transducer and the second input transducer, on the substrate.

In another embodiment of the present invention, a communication system comprises:

a transmitter for transmitting a signal modulated according to information;

a circuit for receiving the modulated signal transmitted from the transmitter;

a circuit for generating a reference signal;

a surface acoustic wave device for outputting a convolution signal of the modulated signal and the reference signal; and a circuit for demodulating the information, using the convolution signal output from the surface acoustic wave device;

wherein said surface acoustic wave device comprises:

a piezoelectric substrate;

first and second input transducers formed on said substrate and adapted for respectively generating surface acoustic waves corresponding to the modulated signal and the reference signal, said first and second input transducers each having a shape to focus the surface acoustic waves generated thereby;

an output transducer formed between said first and second input transducers on said substrate and adapted for obtaining a convolution signal of the modulated signal and the reference signal from a surface acoustic wave generated by nonlinear interaction of the surface acoustic waves generated by said first and second input transducers; and a conductive film which is formed in at least one of between the output transducer and the first input transducer and between the output transducer and the second input transducer, on the substrate.

Further, a method for performing communication, using the above communication system, comprises:

a step of transmitting a signal modulated according to information from a transmitter;

a step of receiving the modulated signal transmitted from the transmitter, by means of a receiving circuit;

a step of inputting the modulated signal received by the receiving circuit and a reference signal generated by a reference signal generating circuit into the first and second input transducers, respectively;

a step of obtaining a convolution signal of the modulated signal and the reference signal from a surface acoustic wave generated by nonlinear interaction of the surface acoustic waves generated by said first and second input transducers;

a step of outputting the convolution signal from the output transducer; and a step of demodulating the information by a demodulating circuit from the convolution signal output from the output transducer.

BRIEF DESCRIPTION OF THE DRAWINGS

FIG. 9 to FIG. 11 are block diagrams to show modifications of the receiver in FIG. 7.

DESCRIPTION OF THE PREFERRED EMBODIMENTS

Embodiments of the present invention will be described with reference to the accompanying drawings.

First Embodiment

Figure 1:
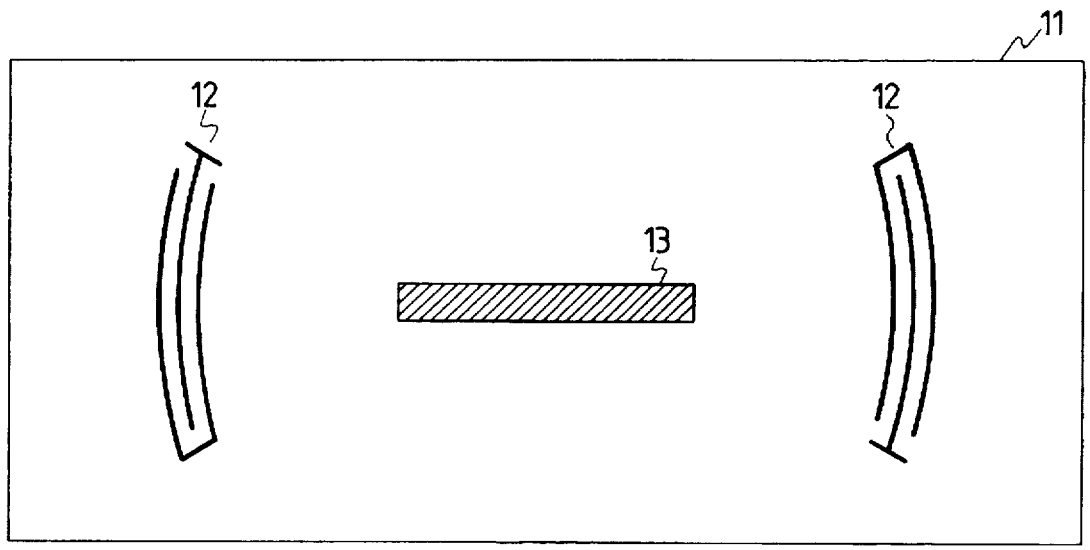
FIG. 1 is a schematic plan view to show an example of conventional surface acoustic wave device.
Figure 2:
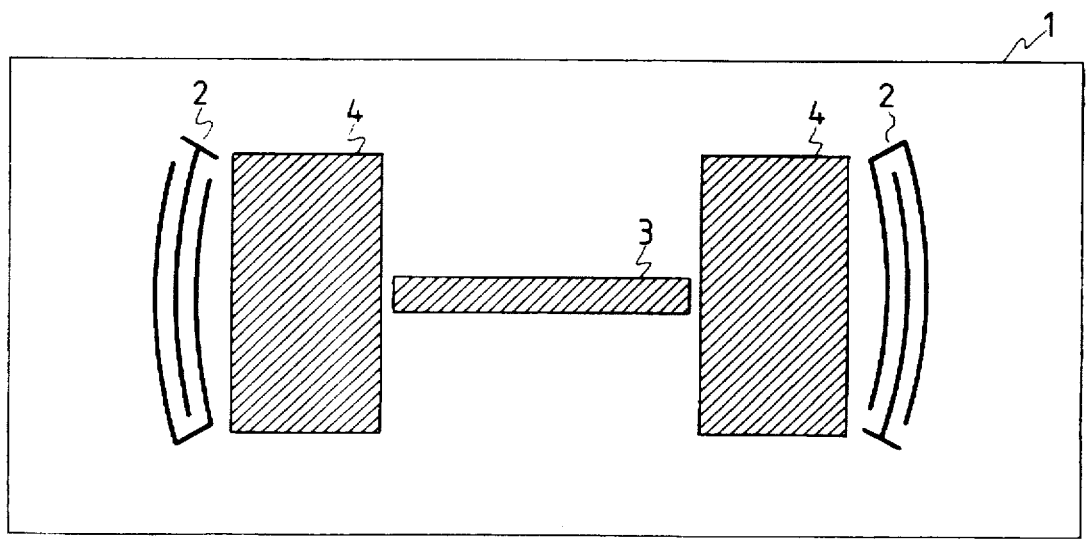
FIG. 2 is a schematic plan view to show a first embodiment of surface acoustic wave device according to the present invention.

FIG. 2 is a schematic plan view to show the first embodiment of surface acoustic wave device according to the present invention. In FIG. 2, reference numeral 1 designates a piezoelectric substrate made of Y-cut (Z-propagating) lithium niobate crystal, 2 input interdigital transducers (IDTs) which are arcuate comb electrodes formed on the surface of the piezoelectric substrate 1, 3 an output transducer which is a waveguide electrode formed on the surface of piezoelectric substrate 1, and 4 conductive metal films each formed in a region between the input IDT 2 and the output transducer 3 on the surface of piezoelectric substrate 1. These electrodes are made for example of a conductive material such as aluminum and usually formed directly on the surface of piezoelectric substrate 1, utilizing the photolithography technology. The comb electrodes constituting the input IDTs 2 are formed in an arcuate shape to focus surface acoustic waves excited at the input electrodes toward the entrance end faces of the output transducer 3.

When an electric signal with carrier angular frequency ω is input into the input IDTs 2 in such surface acoustic wave device as so arranged, the piezoelectric effect of the substrate 1 excites surface acoustic waves. These two surface acoustic waves propagate in mutually opposite directions on the piezoelectric substrate 1 as trapped in the output transducer (waveguide electrode), because the output transducer 3 acts as ΔV/V waveguide. Then, the two surface acoustic waves collide with each other on the output transducer 3, so that a convolution signal (with carrier angular frequency 2ω) of the two input signals may be obtained through the output electrode 3 by the physical nonlinear effect of the piezoelectric substrate 1.

Here, the ΔV/V waveguide electrically shorts the substrate surface to keep the propagation speed of surface acoustic waves lower than that on free surface and thereby to trap the surface acoustic waves in the short portion.

Figure 3:
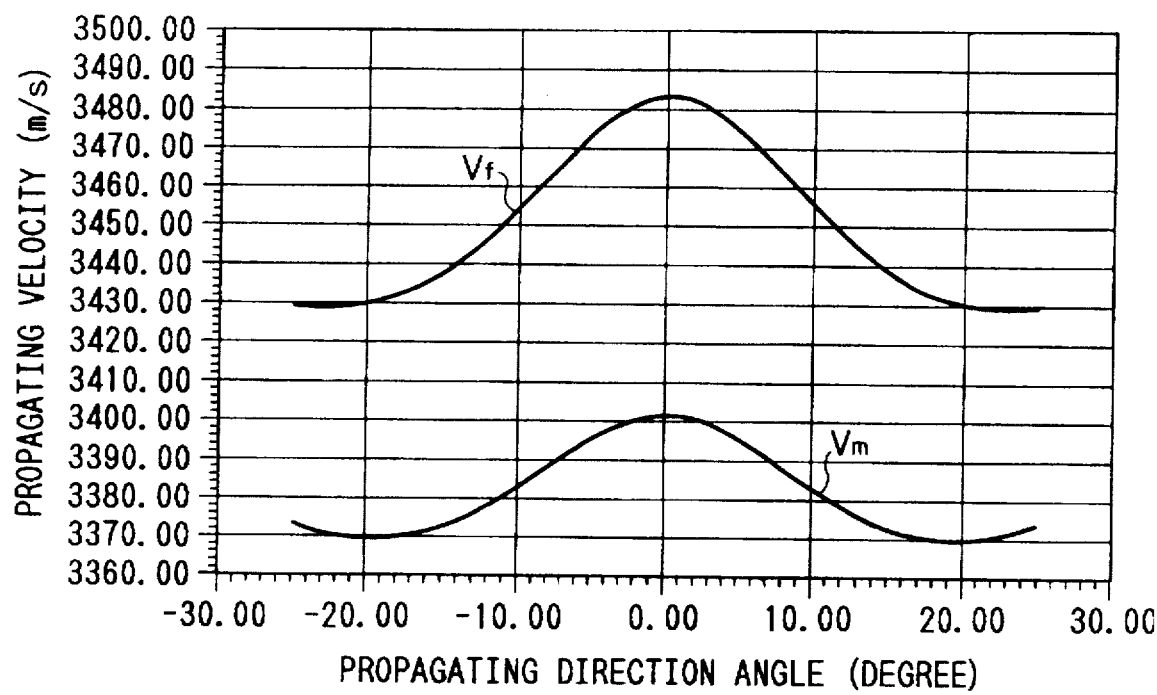
FIG. 3 is a graph to show a relation between propagation direction and propagation speed of surface acoustic wave on Y-cut lithium niobate substrate.

FIG. 3 is a graph to show a change in speed of surface acoustic waves depending upon the direction of propagation (represented by angle to the Z direction) on the Y-cut lithium niobate crystal substrate. In FIG. 3, Vf represents a propagation speed in case of the substrate surface being a free surface and Vm a propagation speed in case of the substrate surface having the films of conductive material formed thereon.

It is seen from FIG. 3 that when the input IDTs are formed as arcuate comb electrodes having a view angle of ±20° with respect to the Z direction on the Y-cut (Z-propagating) lithium niobate crystal substrate, a maximum difference in propagation speed between surface acoustic waves traveling from respective segmental areas of input IDTs toward the entrance end faces of output transducer (waveguide electrode) is about 60 m/s in case of the substrate surface being a free surface whereas the maximum difference is about 36 m/s in case of the films of conductive material being formed in the regions between the input IDTs and the output transducer on the substrate, thus relieving the anisotropy of propagation speed.

Since the first embodiment is so arranged that the films 4 of conductive material are formed on the regions between the input IDTs 2 and the output transducer 3 on the substrate 1, the difference in SAW speed depending upon the propagation direction is relieved.

Figure 4:
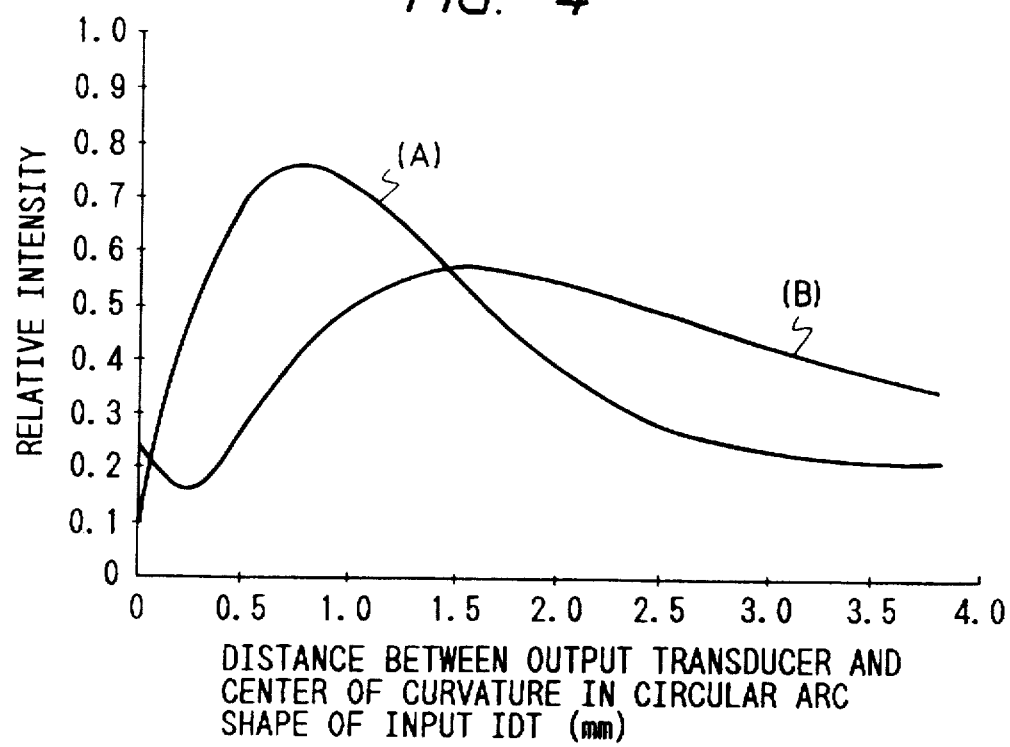
FIG. 4 is a graph to show a relation between relative intensity of surface acoustic wave and distance between the center of curvature of arcuate input IDT and the output transducer.

FIG. 4 is a graph to show a change in relative intensity of surface acoustic waves guided into the output electrode, depending upon the Z-directional distance between the center of curvature of the arcuate input IDTs 2 and the output transducer 3 in the case that the input IDTs are formed as arcuate comb electrodes having a view angle of ±15° with respect to the Z direction on the Y-cut (Z-propagating) lithium niobate crystal substrate 1. In FIG. 4, (A) stands for a case in which the films 4 of conductive material are provided on the regions of substrate surface between the input IDTs 2 and the output transducer 3 (which is the embodiment of the present invention). Further, (B) represents a case in which no film of conductive material is provided in the regions of substrate surface between the input IDTs 2 and the output transducer 3 (which is a conventional example).

It is seen from FIG. 4 that in the case of (A) the focused position of surface acoustic waves is closer to the center of curvature of arcuate input IDTs than that in the case of (B). This means that the anisotropy of propagation speed of surface acoustic waves is relieved in the embodiment of the present invention. Further, it is seen that in the case of (A) the relative intensity of surface acoustic waves at the focused position is about 30% greater than that in the case of (B).

FIG. 4 was obtained using the Huygens equation. The detailed method of calculation is described in "FOCUSED SURFACE WAVE TRANSDUCERS ON ANISOTROPIC SUBSTRATES: A THEORY DEVELOPED FOR THE WAVEGUIDED STORAGE CORRELATOR, J. B. Green, G. S. Kino and B. T. Khuri-Yakob, IEEE ULTRASONICS SYMPOSIUM, P 69 (1980)."

As described above, the arrangement as shown in FIG. 2 can relieve the anisotropy of propagation speed of surface acoustic waves, so that the surface acoustic waves excited at respective points in the arcuate comb electrodes constituting the input IDTs 2 have substantially the same phase at the entrance end faces of output transducer so as to be better focused and to be trapped in the waveguide together with those conventionally leaking without entering the output transducer (waveguide electrode), which decreases the input loss. Then surface acoustic waves respectively excited from the two arcuate comb electrodes (input IDTs) 2 propagate in mutually opposite directions. When they collide with each other on the output transducer 3, a convolution signal is generated. The thus generated signal can be taken out with extremely low loss.

The designing of electrodes is easy, because the shape of arcuate comb electrodes (input IDTs 2) is simple.

Although the above description concerns the examples in which the view angle of comb electrodes (input IDTs 2) is within a specific range, the present invention does not have to be limited to the examples. The range of view angle can be set wider than the specific range.

Second Embodiment

Figure 5:
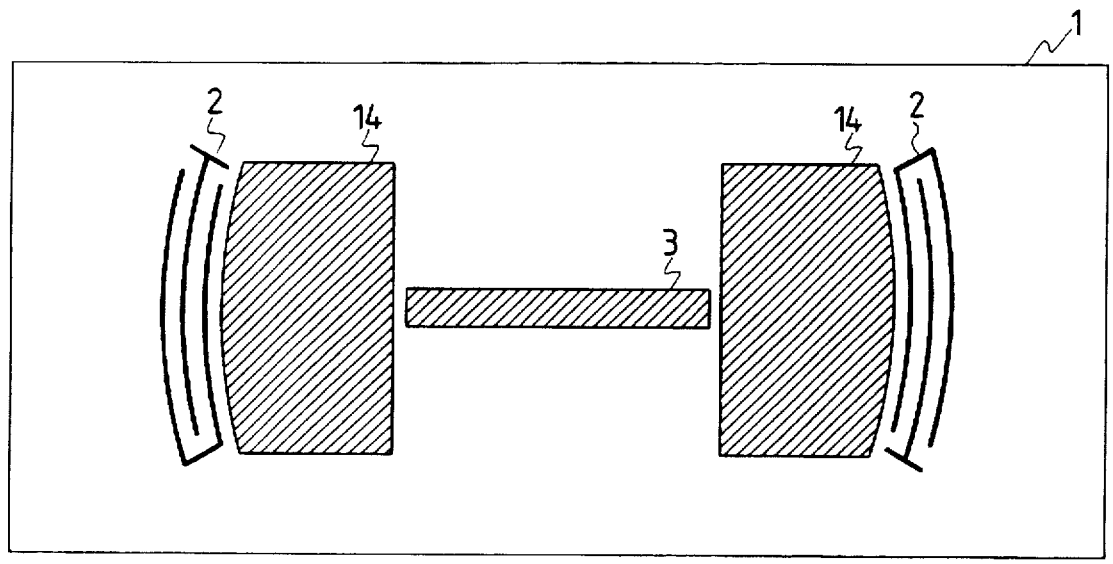
FIG. 5 is a schematic plan view to show a second embodiment of surface acoustic wave device according to the present invention.

FIG. 5 is a schematic plan view to show the second embodiment of surface acoustic wave device according to the present invention. In FIG. 5, the same members as those in FIG. 2 are denoted by the same reference numerals.

In the present embodiment, each of conductive films 14 has an arcuate end on the side of input IDT 2 which is an arcuate comb electrode. The arcuate end has the same curvature as the arcuate input IDTs have.

Such arrangement can further relieve the difference in propagation speed depending upon the direction in propagation of surface acoustic waves in the regions between the input IDTs 2 and the output transducer 3 on the surface of substrate 1, as compared with the first embodiment as described above, whereby the focused condition of surface acoustic waves is further improved at the entrance ends of output transducer 3 so as to further reduce the input loss.

Third Embodiment

Figure 6:
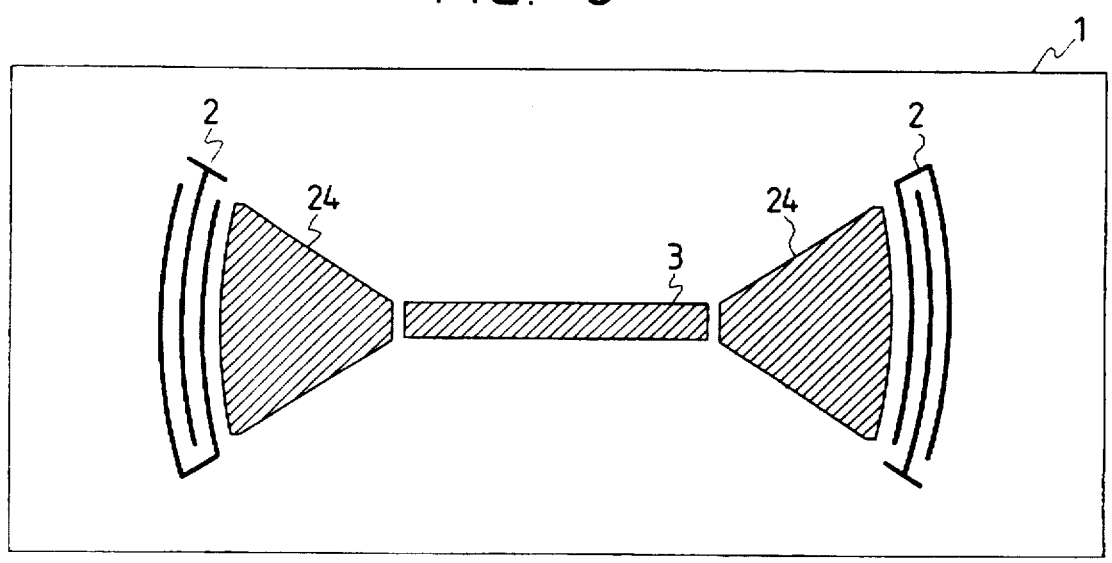
FIG. 6 is a schematic plan view to show a third embodiment of surface acoustic wave device according to the present invention.

FIG. 6 is a schematic plan view to show the third embodiment of surface acoustic wave device according to the present invention. In FIG. 6, the same members as those in FIG. 2 and in FIG. 5 are denoted by the same reference numerals.

In the present embodiment, each of conductive films 24 has an arcuate end on the side of IDT 2 which is an arcuate comb electrode. The each arcuate end has the same center and curvature as those of the facing arcuate input IDT 2. Further, the conductive films 24 are formed in a taper shape gradually decreasing its width from the input IDT 2 side to the output transducer 3 side.

Such arrangement can enjoy the same effect as the second embodiment. Further, since the conductive films 24 are formed to change their width from the side of input IDTs 2 to the side of output transducer 3 so as to focus the surface acoustic waves, the input loss can be further reduced based on the further improvement in focused condition.

Figure 7:
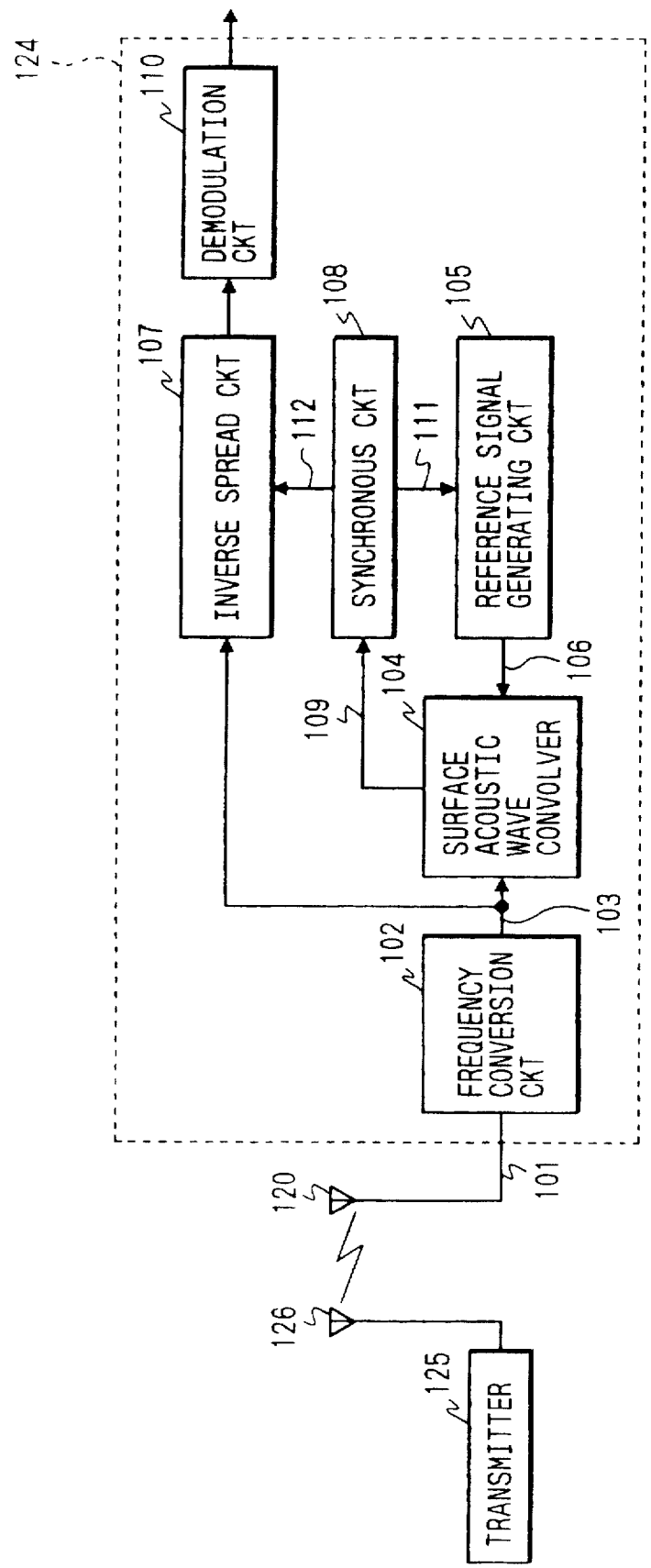
FIG. 7 is a block diagram to show an example of communication system using a surface acoustic wave device of the present invention.

FIG. 7 is a block diagram showing an example of a communication system using such a surface acoustic wave device as above described as the convolver. In FIG. 7, numeral 125 indicates a transmitter. This transmitter spreads spectrum for a signal to be transmitted and transmits the signal from an antenna 126. A transmitted signal is received at an antenna 120 of a receiver 124, and a received signal 101 is input to a frequency conversion circuit 102. An IF signal 103, the frequency of which is converted to match with an input frequency of surface acoustic wave convolver in a frequency conversion circuit 102, is input to a convolver consisting of a surface acoustic wave device 104 of the present invention as shown in FIGS. 2, 5 and 6. Hereby, the IF signal 103 is input to one input transducer of the convolver, e.g. a transducer 2 in right side of FIG. 2.

On the other hand, a reference signal 106 output from a reference signal generating circuit 105 is input to the other input transducer of the surface acoustic wave convolver 104, e.g. a transducer 2 in left side of FIG. 2. And in the convolver 104, the convolution (correlation) operation of the IF signal 103 and the reference signal 106 is performed as previously described, and an output signal (convolution signal) 109 is output from an output transducer, e.g., a transducer 3 of FIG. 2.

Figure 8:
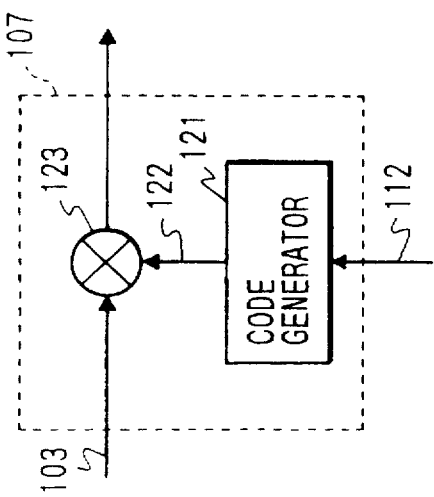
FIG. 8 is a block diagram to show a specific example of construction of inverse spread circuit in FIG. 7.

This output signal 109 is input to a synchronous circuit 108. The synchronous circuit 108 produces synchronizing signals 111 and 112 from the output signal 109 of the surface acoustic wave convolver 104, which are input into the reference signal generating circuit 105 and an inverse spread circuit 107, respectively. The reference signal generating circuit 105 outputs the reference signal 106 at the timing regulated with a synchronizing signal 111. The inverse spread circuit 107 restores the IF signal 103 to a signal before the spread spectrum, using a synchronizing signal 112. This signal is converted into an information signal in a demodulation circuit 110 and then output. FIG. 8 shows a configuration example of the inverse spread circuit 107. In FIG. 8, 121 is a code generator, and 123 is a multiplier. The synchronizing signal 112 output from the synchronous circuit 108 is input into the code generator 121, and a code 122 having its timing adjusted with that synchronizing signal 112 is output therefrom. The IF signal 103 and the code 122 are input into the multiplier 123, and a multiplied result of IF signal 103 and code 122 is output therefrom. At this time, if the timing between the IF signal 103 and the code 122 is coincident, the IF signal 103 is converted into a signal before the spread spectrum and then output.

It is noted that when the frequency of received signal 101 is coincident with the input frequency of surface acoustic wave convolver 104, the frequency conversion circuit 102 is unnecessary, in which the received signal 101 can be input through an amplifier and a filter directly into the surface acoustic wave convolver 104. Also in FIG. 7, in order to make the explanation more clearly, the amplifier and the filter are omitted, whereas the amplifier and the filter may be inserted at previous or later stage of each block as required. Moreover, while in this example, a transmission signal is received at the antenna 120, it is also possible to connect the transmitter and the receiver with a wire system such as a cable, without using the antenna 120.

Figure 9:
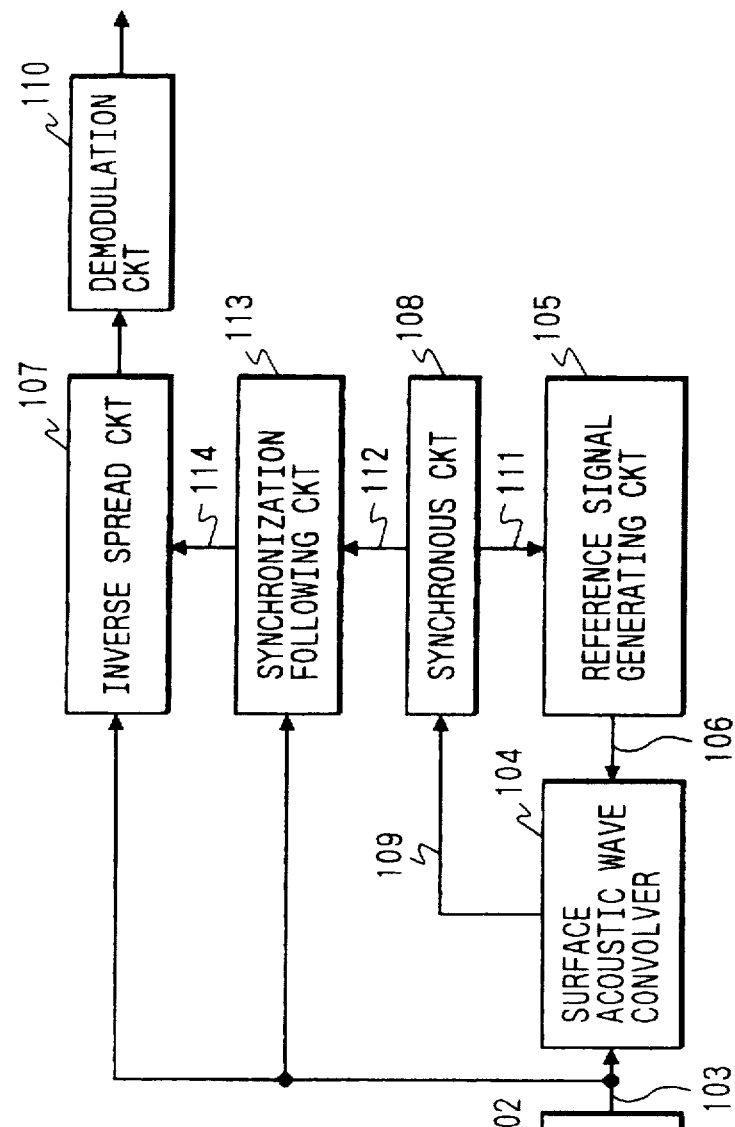

FIG. 9 is a block diagram showing a first variation of receiver 124 in the communication system of FIG. 7. In FIG. 9, the same numerals are appended to the same parts as in FIG. 7, and the detailed explanation is omitted.

In this example, there is provided a synchronization following circuit 113 into which the IF signal 103 is also input. Also, a synchronizing signal 112 output from the synchronous circuit 108 is input to the synchronization following circuit 113, and a synchronizing signal 114 output from the synchronization following circuit 113 is input to the inverse spread circuit 107. This example is different from that of FIG. 7 in these respects. As the synchronization following circuit, there are a tau dither loop circuit and a delay lock loop circuit, either of which can be used.

In this example, the same action effects as those of FIG. 7 can be obtained, but further in this example, the synchronization following is performed such that after synchronization is roughly achieved in a synchronous circuit 108, the synchronization is further made in the synchronization following circuit 113 so as to be more accurate, so that the out-of-phase is not likely to occur and the error rate can be decreased.

FIG. 10 is a block diagram showing a second variation of receiver 124 in the communication system of FIG. 7. In FIG. 10, the same numerals are appended to the same parts as in FIG. 7, and the detailed explanation is omitted.

In this example, the output from the surface acoustic wave convolver 104 is input to a detection circuit 115, the output of which is used for the demodulation. As the detection circuit 115, there is a synchronous detection circuit, a delay detection circuit or an envelope detection circuit, which can be selected in use depending on the modulation method of signal.

Assuming that the received signal 101 is a modulated signal in phase modulation, frequency modulation or amplitude modulation, the output 109 from the surface acoustic wave convolver 104 is reflective of the modulated information. Particularly, if the length d of waveguide for the surface acoustic wave convolver 104 satisfies d=vT where the time per bit of data is T for the received signal 101 and the velocity of surface acoustic wave is v, the modulated information appears directly on the output 109. For example, assume that a phase modulated signal f(x)exp(jθ) is transmitted, and that signal is received as the received signal 101. In this case, if a reference signal g(t) 106 is input to the surface acoustic wave device 104, its output 109 becomes $$\int f(t) \exp(j\theta) g(\tau-t) dt = \exp(j\theta) \int f(t) g(\tau-t) dt \qquad (3)$$

and the phase modulated information appears. Therefore, the output 109 from the surface acoustic wave element 104 can be demodulated through an appropriate detection circuit 115.

Figure 11:
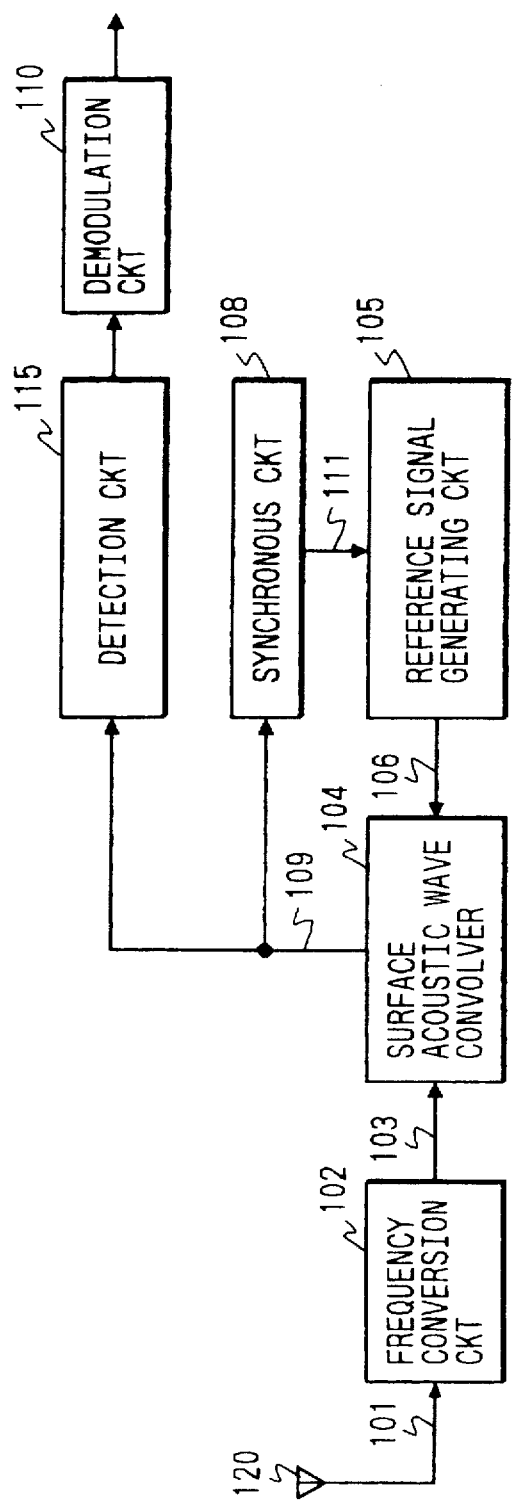

FIG. 11 is a block diagram showing a third variation of receiver 124 of FIG. 7. In FIG. 11, the same numerals are appended to the same parts as in FIG. 10, and the detailed explanation is omitted.

In this example, there is provided a synchronous circuit 108 into which the output 109 from the surface acoustic wave convolver 104 is also input. Also, a synchronizing signal 111 is output from the synchronous circuit 108 and input to the reference signal generating circuit 105. This example is different from that of FIG. 10, in these respects.

In this example, the same action effects as those of FIG. 10 can be obtained, but further in this example, by providing the synchronous circuit 108 and controlling the reference signal generating circuit 105 with the synchronizing signal 111 output from the synchronous circuit 108, the synchronization can be made more stably.

The present invention has various applications and embodiments other than the embodiments as described above. For example, the first to third embodiments employ the Y-cut (Z-propagating) lithium niobate as the piezoelectric substrate 1, but the present invention may employ other piezoelectric materials or other materials with another cut direction for the piezoelectric substrate.

Further, the above first to third embodiments employ the same conductive material for the conductive films 4, 14, 24 as that for the input IDTs 2 and the output transducer 3, but the present invention can use a conductive material different from that for the input IDTs 2 and the output transducer 3. In addition, the thickness of the conductive films does not have to be limited to a constant thickness. For example, the conductive films can be formed such that the film is thick in the center but thin at the periphery to facilitate the focusing of surface acoustic waves.

Also, the above first to third embodiments had the arcuate comb electrodes constituting the input IDTs, but the present invention does not have to be limited to such shape of input IDTs. The input IDTs may be formed in any shape to focus the surface acoustic waves toward the entrance ends of output transducer. For example, each electrode may be constructed of a plurality of curve elements.

Although the second and third embodiments each are so arranged that the conductive films 14, 24 each have an arcuate end on the input IDT 2 side with a curvature matching with that of the arcuate shape of input IDTs, the end does not have to match in curvature with the input IDT but may match in shape therewith. In more detail, the conductive films may be present between respective points in input IDTs and the entrance ends of output transducer while having uniformity independent of the view angle.

Also, although the above first to third embodiments employ the elastic SAW convolver, the present invention may employ an AE (acousto-electric) convolver.

In this embodiment, although the conductive films are formed between the first input transducer and the output transducer and between the second input transducer and the output transducer, respectively, the same effect can be attained in the case of forming a conductive film in at least one of between the first input transducer and the output transducer and between the second input transducer and the output transducer.

The present invention includes all such applications and embodiments dropping within the scope of the appended claims.

As described above, according to the present invention, the conductive films are formed in the regions between the input transducers and the output transducer on the surface of piezoelectric substrate so as to relieve the difference in propagation speed of surface acoustic waves due to the anisotropy of piezoelectric substrate, thus decreasing the phase shift at the entrance ends of output transducer between surface acoustic waves excited by the input transducers so as to improve the focused condition and therefore to decrease the input loss. Therefore, the drop of convolution efficiency can be minimized.

What is claimed is:

1. A surface acoustic wave device comprising:

a piezoelectric substrate having an anisotropy;

first and second input transducers formed on said substrate and adapted for respectively generating surface acoustic waves corresponding to input signals, each of said first and second input transducers being formed in an arcuate shape which causes an anisotropy in that propagation speeds of surface acoustic waves generated at respective portions of each of said arcuate first and second transducers differ from each other due to the anisotropy of the piezoelectric substrate;

an output transducer formed between said first and second input transducers on said substrate and adapted for obtaining a convolution signal of said input signals from a surface acoustic wave generated by nonlinear interaction of the surface acoustic waves generated by said first and second input transducers, said each of said first and second input transducers being concave toward said output transducer so that the surface acoustic waves generated by said arcuate first and second input transducers are focused toward said output transducer; and a conductive film which is formed in at least one of between the output transducer and the first input transducer and between the output transducer and the second input transducer, on the substrate, for relieving the anisotropy of the propagation speeds of the surface acoustic waves generated by said input transducer.

2. A surface acoustic wave device according to claim 1, wherein said first and second input transducers each comprise a comb electrode formed in an arcuate shape.

3. A surface acoustic wave device according to claim 2, wherein an end of each conductive film near the input transducer is formed in an arcuate shape with a same curvature as that of the arcuate comb electrode.

4. A surface acoustic wave device according to claim 1, wherein each of said conductive films has a shape gradually decreasing its width from the side near the input transducer to the side near the output transducer.

5. A surface acoustic wave device according to claim 1, wherein said output transducer is an electrode forming a waveguide which permits the surface acoustic waves generated by the first and second input transducers to propagate in mutually opposite directions.

6. A surface acoustic wave device according to claim 1, wherein said piezoelectric substrate is made of a Y-cut lithium niobate crystal.

7. A device according to claim 1, wherein a propagation velocity of the surface acoustic wave generated by each of said first and second input transducers differs depending on a propagation direction in said piezoelectric substrate.

8. A device according to claim 1, wherein the surface acoustic waves generated by said input transducers are never reflected by a side portion of said conductive film.

9. A device according to claim 1, wherein said conductive film never focuses the surface acoustic waves generated by said input transducers.

10. A device according to claim 1, wherein said conductive film has a constant width.

11. A signal receiver comprising:

a circuit for receiving a modulated signal transmitted from a transmitter;

a circuit for generating a reference signal;

a surface acoustic wave device for outputting a convolution signal of the modulated signal and the reference signal; and a circuit for demodulating information, using the convolution signal output from the surface acoustic wave device;

wherein said surface acoustic wave device comprises:

a piezoelectric substrate having an anisotropy;

first and second input transducers formed on said substrate and adapted for respectively generating surface acoustic waves corresponding to the modulated signal and the reference signal, each of said first and second input transducers being formed in an arcuate shape which causes an anisotropy in that propagation speeds of surface acoustic waves generated at respective portions of each of said arcuate first and second transducers differ from each other arcuate first and second transducers differ from each other due to the anisotropy of the piezoelectric substrate;

an output transducer formed between said first and second input transducers on said substrate and adapted for obtaining a convolution signal of the modulated signal and the reference signal from a surface acoustic wave generated by nonlinear interaction of the surface acoustic waves generated by said first and second input transducers, said each of said first and second input transducers being concave toward said output transducer so that the surface acoustic waves generated by said arcuate first and second transducers are focused toward said output transducer; and a conductive film which is formed in at least one of between the output transducer and the first input transducer and between the output transducer and the second input transducer, on the substrate, for relieving the anisotropy of the propagation speeds of the surface acoustic waves generated by said input transducer.

12. A signal receiver according to claim 11, wherein said first and second input transducers in said surface acoustic wave device each comprise a comb electrode formed in an arcuate shape.

13. A signal receiver according to claim 12, wherein an end of each conductive film near the input transducer in said surface acoustic wave device is formed in an arcuate shape with a same curvature as that of the arcuate comb electrode.

14. A signal receiver according to claim 11, wherein each of said conductive films in said surface acoustic wave device has a shape gradually decreasing its width from the side near the input transducer to the side near the output transducer.

15. A signal receiver according to claim 11, wherein said output transducer in said surface acoustic wave device is an electrode forming a waveguide which permits the surface acoustic waves generated by the first and second input transducers to propagate in mutually opposite directions.

16. A signal receiver according to claim 11, wherein said piezoelectric substrate in said surface acoustic wave device is made of a Y-cut lithium niobate crystal.

17. A signal receiver according to claim 11, wherein a propagation velocity of the surface acoustic wave generated by each of said first and second input transducers differs depending on a propagation direction in said piezoelectric substrate.

18. A device according to claim 11, wherein the surface acoustic waves generated by said input transducers are never reflected by a side portion of said conductive film.

19. A device according to claim 11, wherein said conductive film never focuses the surface acoustic waves generated by said input transducers.

20. A device according to claim 11, wherein said conductive film has a constant width.

21. A communication system comprising:

a transmitter for transmitting a signal modulated according to information;

a circuit for receiving the modulated signal transmitted from the transmitter;

a circuit for generating a reference signal;

a surface acoustic wave device for outputting a convolution signal of the modulated signal and the reference signal; and a circuit for demodulating the information, using the convolution signal output from the surface acoustic wave device;

wherein said surface acoustic wave device comprises:

a piezoelectric substrate having an anisotropy;

first and second input transducers formed on said substrate and adapted for respectively generating surface acoustic waves corresponding to the modulated signal and the reference signal, each of said first and second input transducers being formed in an arcuate shape which causes an anisotropy in that propagation speeds of surface acoustic waves generated at respective portions of each of said arcuate first and second transducers differ from each other due to the anisotropy of the piezoelectric substrate;

an output transducer formed between said first and second input transducers on said substrate and adapted for obtaining a convolution signal of the modulated signal and the reference signal from a surface acoustic wave generated by nonlinear interaction of the surface acoustic waves generated by said first and second input transducers, said each of said first and second input transducers being concave toward said output transducer so that the surface acoustic waves generated by said arcuate first and second transducers are focused toward said output transducer; and conductive films, one formed between the first input transducer and the output transducer and another between the second input transducer and the output transducer on said substrate, for relieving the anisotropy of the propagation speeds of the surface acoustic waves generated by said input transducer.

22. A communication system according to claim 21, wherein said first and second input transducers in said surface acoustic wave device each comprise a comb electrode formed in an arcuate shape.

23. A communication system according to claim 22, wherein an end of each conductive film near the input transducer in said surface acoustic wave device is formed in an arcuate shape with a same curvature as that of the arcuate comb electrode.

24. A communication system according to claim 21, wherein each of said conductive films in said surface acoustic wave device has a shape gradually decreasing its width from the side near the input transducer to the side near the output transducer.

25. A communication system according to claim 21, wherein said output transducer in said surface acoustic wave device is an electrode forming a waveguide which permits the surface acoustic waves generated by the first and second input transducers to propagate in mutually opposite directions.

26. A communication system according to claim 21, wherein said piezoelectric substrate in said surface acoustic wave device is made of a Y-cut lithium niobate crystal.

27. A communication system according to claim 21, wherein a propagation velocity of the surface acoustic wave generated by each of said first and second input transducers differs depending on a propagation direction in said piezoelectric substrate.

28. A device according to claim 21, wherein the surface acoustic waves generated by said input transducers are never reflected by a side portion of said conductive film.

29. A device according to claim 21, wherein said conductive film never focuses the surface acoustic waves generated by said input transducers.

30. A device according to claim 21, wherein said conductive film has a constant width.

31. A method for obtaining a convolution signal, using a surface acoustic device comprising:

a piezoelectric substrate having an anisotropy;

first and second input transducers formed on said substrate and adapted for respectively generating surface acoustic waves corresponding to input signals, each of said first and second input transducers being formed in an arcuate shape which causes an anisotropy in that propagation speeds of surface acoustic waves generated at respective portions of each of said arcuate first and second transducers differ from each other due to the anisotropy of the piezoelectric substrate;

an output transducer formed between said first and second input transducers on said substrate, said each of said first and second input transducers being concave toward said output transducer so that the surface acoustic waves generated by said arcuate first and second transducers are focused toward said output transducer; and a conductive film which is formed in at least one of between the output transducer and the first input transducer and between the output transducer and the second input transducer, on the substrate, for relieving the anisotropy of the propagation speeds of the surface acoustic waves generated by said input transducer;

said method comprising steps of:

inputting an input signal into each of the first and second input transducers;

making the first and second input transducers respectively generate surface acoustic waves corresponding to the input signals;

obtaining a convolution signal of said input signals from a surface acoustic wave generated by nonlinear interaction of the surface acoustic waves generated by said first and second input transducers; and outputting the convolution signal from the output transducer.

32. A method for performing communication, using a communication system comprising:

a transmitter for transmitting a signal modulated according to information;

a circuit for receiving the modulated signal transmitted from the transmitter;

a circuit for generating a reference signal;

a surface acoustic wave device for outputting a convolution signal of the modulated signal and the reference signal; and a demodulating circuit for demodulating the information, using the convolution signal output from the surface acoustic wave device;

wherein said surface acoustic wave device comprises:

a piezoelectric substrate having an anisotropy;

first and second input transducers formed on said substrate and adapted for respectively generating surface acoustic waves corresponding to the modulated signal and the reference signal, each of said first and second input transducers being formed in an arcuate shape which causes an anisotropy in that propagation speeds of surface acoustic waves generated at respective portions of each of said arcuate first and second transducers differ from each other due to the anisotropy of the piezoelectric;

an output transducer formed between said first and second input transducers on said substrate, said each of said first and second input transducers being concave toward said output transducer so that the surface acoustic waves generated by said arcuate first and second transducers are focused toward said output transducer; and a conductive film which is formed in at least one of between the output transducer and the first input transducer and between the output transducer and the second input transducer, on the substrate, for relieving the anisotropy of the propagation speeds of the surface acoustic waves generated by said input transducer;

said method comprising steps of:

transmitting a signal modulated according to information from the transmitter;

receiving the modulated signal transmitted from the transmitter, by means of the receiving circuit;

inputting the modulated signal received by the receiving circuit and the reference signal generated by the reference signal generating circuit into the first and second input transducers, respectively;

obtaining a convolution signal of the modulated signal and the reference signal from a surface acoustic wave generated by nonlinear interaction of the surface acoustic waves generated by said first and second input transducers;

outputting the convolution signal from the output transducer; and demodulating the information by the demodulating circuit from the convolution signal output from the output transducer.

33. A surface acoustic wave device comprising:

a piezoelectric substrate having an anisotropy;

an input transducer formed on said substrate and adapted for generating surface acoustic waves, said input transducer being formed in an arcuate shape which causes an anisotropy in that propagating speeds of surface acoustic waves generated at portions of said input transducer differ from each other due to the anisotropy of the piezoelectric substrate, said input transducer being concave toward a portion toward which the surface acoustic waves generated by said input transducer are focused; and a conductive film which is formed, on the substrate, a path through which the surface acoustic waves generated by said input transducer are focused, for relieving the anisotropy of the propagation speeds of the surface acoustic waves generated by said input transducer.

34. A device according to claim 33, wherein the surface acoustic waves generated by said input transducers are never reflected by a side portion of said conductive film.

35. A device according to claim 33, wherein said conductive film never focuses the surface acoustic waves generated by said input transducers.

36. A device according to claim 33, wherein said conductive film has a constant width.

* * * * *

UNITED STATES PATENT AND TRADEMARK OFFICE
CERTIFICATE OF CORRECTION

PATENT NO. : 5,760,525
DATED : June 2, 1998
INVENTOR(S) : Takahiro Hachisu, et al.

Page 1 of 2

It is certified that error appears in the above-identified patent and that said Letters Patent is hereby corrected as shown below:

On the title page, item [57],

Line 9, "-signal" should read --signal--.

COLUMN 1

Line 11, "of" should read --of a--;
Line 19, "the" should read --a--; and
Line 21, "of" should read --of a--.

COLUMN 2

Line 22, "such a problem was arisen" should read --a problem arose such--.

COLUMN 8

Line 31, "out-of-phase" should read --out-of-phase condition--.

COLUMN 9

Line 58, "dropping" should read --falling--.

COLUMN 11

Line 18, "accurate first and second transducers differ from each" should be deleted; and
Line 19, "other" should be deleted.

UNITED STATES PATENT AND TRADEMARK OFFICE
CERTIFICATE OF CORRECTION

PATENT NO. :  5,760,525
DATED       :  June 2, 1998
INVENTOR(S) :  Takahiro Hachisu, et al.

It is certified that error appears in the above-identified patent and that said Letters Patent is hereby corrected as shown below:

<u>COLUMN 14</u>

Line 9, "piezoelectric" should read
           --piezoelectric substrate--.

Signed and Sealed this

Sixteenth Day of February, 1999

Attest:

Attesting Officer

*Acting Commissioner of Patents and Trademarks*